(12) United States Patent
Wu et al.

(10) Patent No.: US 11,121,236 B2
(45) Date of Patent: Sep. 14, 2021

(54) SEMICONDUCTOR DEVICE WITH AIR SPACER AND STRESS LINER

(71) Applicant: TAIWAN SEMICONDUCTOR MANUFACTURING COMPANY, LTD., Hsinchu (TW)

(72) Inventors: Xusheng Wu, Hsinchu (TW); Chang-Miao Liu, Hsinchu (TW); Huiling Shang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 56 days.

(21) Appl. No.: 16/290,697

(22) Filed: Mar. 1, 2019

(65) Prior Publication Data

US 2020/0105909 A1 Apr. 2, 2020

Related U.S. Application Data

(60) Provisional application No. 62/738,834, filed on Sep. 28, 2018.

(51) Int. Cl.
| | | |
|---|---|---|
| H01L 29/66 | (2006.01) | |
| H01L 29/417 | (2006.01) | |
| H01L 29/40 | (2006.01) | |
| H01L 29/78 | (2006.01) | |
| H01L 21/02 | (2006.01) | |

(52) U.S. Cl.
CPC ...... *H01L 29/66795* (2013.01); *H01L 29/401* (2013.01); *H01L 29/41775* (2013.01); *H01L 29/41791* (2013.01); *H01L 29/6653* (2013.01); *H01L 29/6656* (2013.01); *H01L 29/785* (2013.01); *H01L 29/7843* (2013.01); *H01L 21/02236* (2013.01); *H01L 21/02238* (2013.01);
(Continued)

(58) Field of Classification Search
CPC ............... H01L 29/401; H01L 29/6656; H01L 29/6653; H01L 21/02255; H01L 29/4991; H01L 29/66795; H01L 29/41791; H01L 29/7843; H01L 29/785; H01L 29/41775; H01L 21/02236; H01L 21/02238; H01L 21/02244; H01L 29/7848; H01L 29/165; H01L 29/66545; H01L 29/41
See application file for complete search history.

(56) References Cited

U.S. PATENT DOCUMENTS

2017/0179284 A1* 6/2017 Kim ................... H01L 27/0924

* cited by examiner

*Primary Examiner* — Latanya N Crawford Eason
(74) *Attorney, Agent, or Firm* — Birch, Stewart, Kolasch & Birch, LLP

(57) ABSTRACT

Aspects of the disclosure provide a method for fabricating a semiconductor device. A pre-stress liner is formed over a structure. The structure includes a gate structure having sidewalls. A protection layer is formed. The protection layer covers a first portion of the pre-stress liner that extends along the sidewalls of the gate structure, and exposes a second portion of the pre-stress liner that is away from the sidewalls of the gate structure. An oxygen-containing layer is formed. The oxygen-containing layer covers the pre-stress liner and the protection layer. The oxygen-containing layer is separated from the first portion of the pre-stress liner by the protection layer. The structure is annealed such that the second portion of the pre-stress liner oxidizes by receiving oxygen from the oxygen-containing layer, while the first portion of the pre-stress liner remains unoxidized due to the protection layer.

20 Claims, 14 Drawing Sheets

(52) U.S. Cl.
CPC .. *H01L 21/02244* (2013.01); *H01L 21/02255* (2013.01)

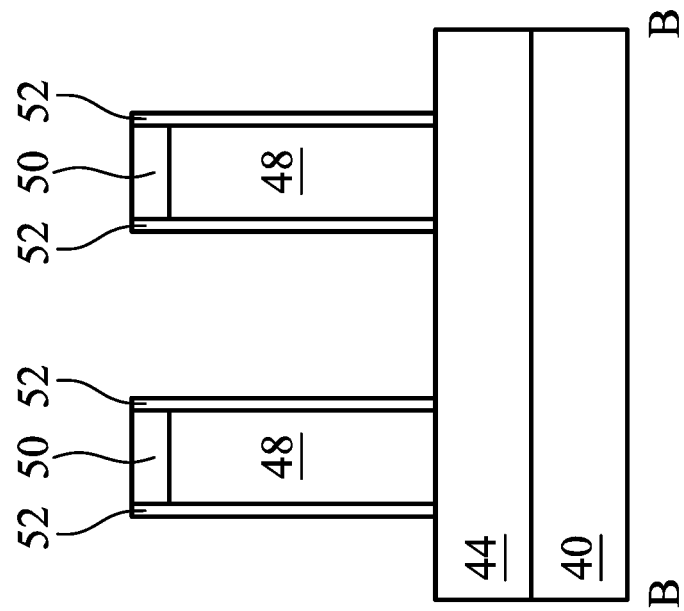
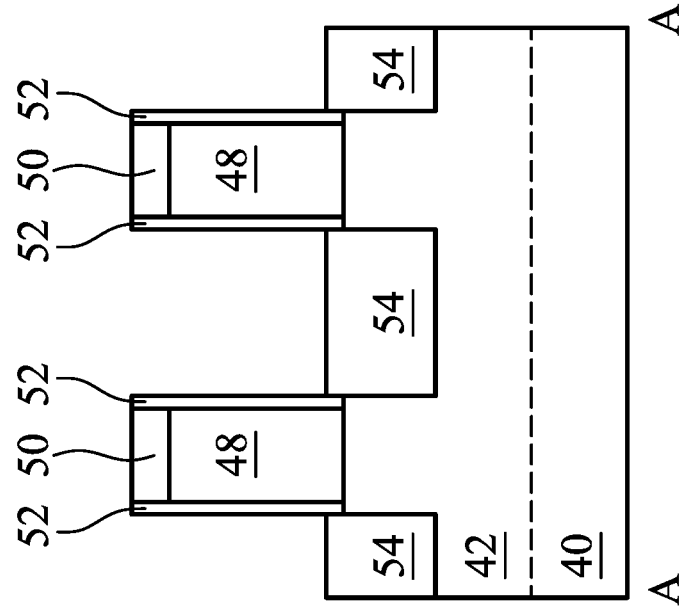

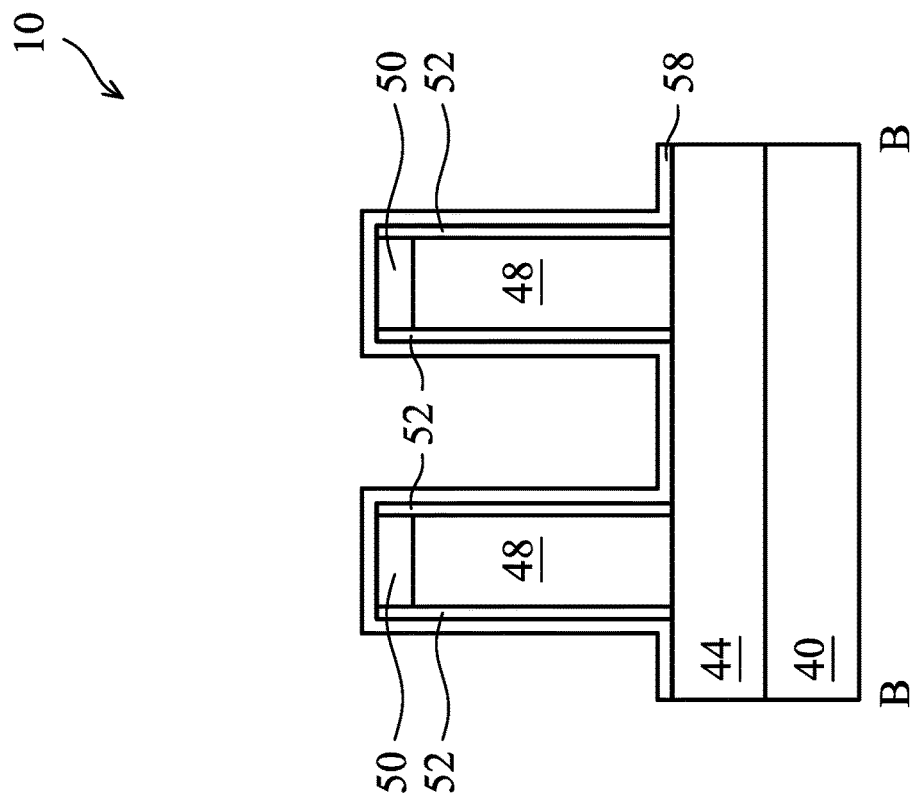
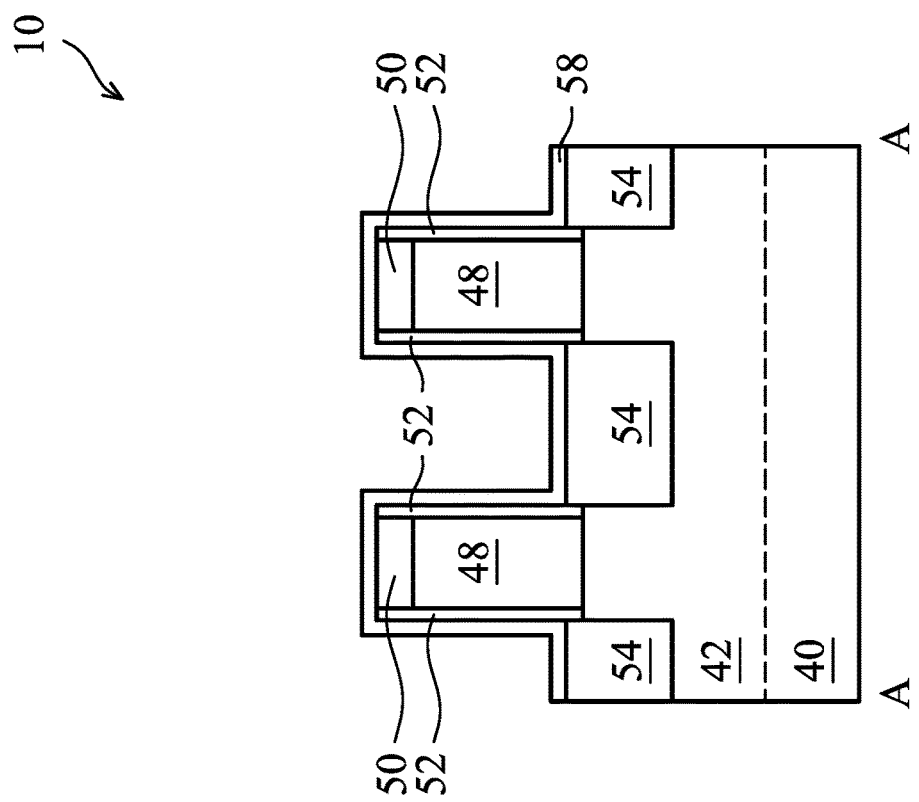
Fig. 5A
Fig. 5B

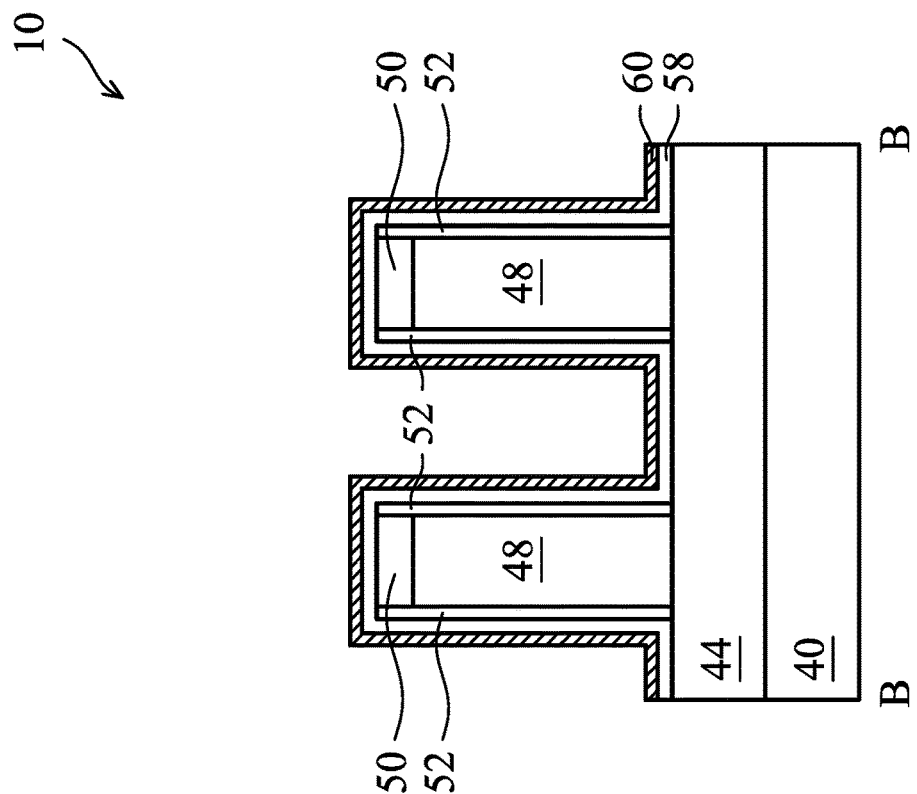
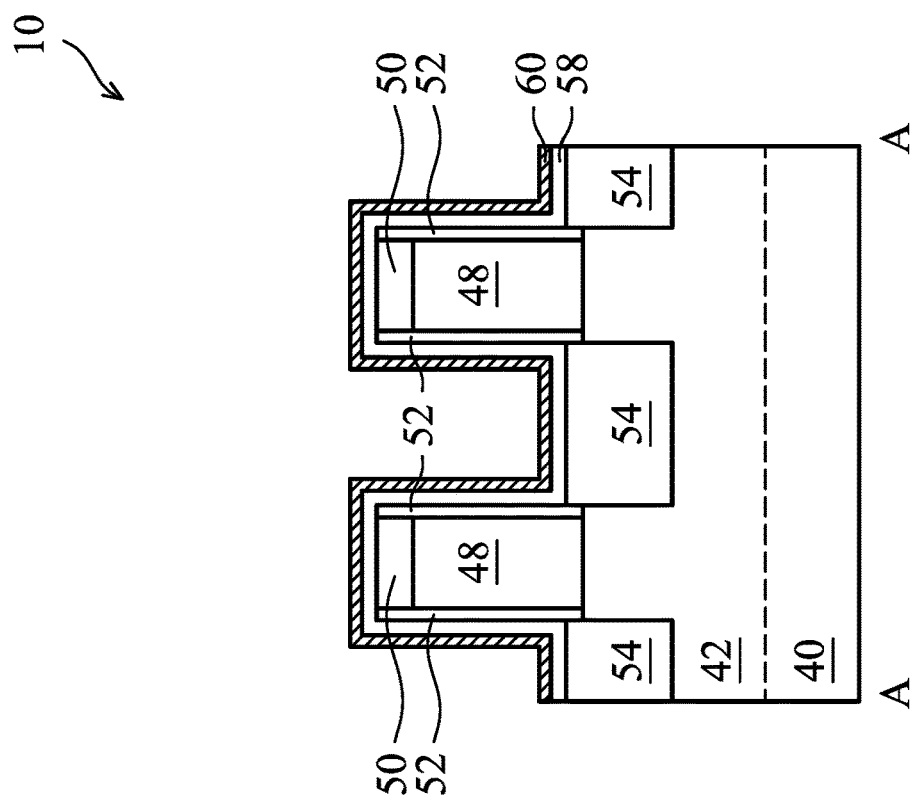

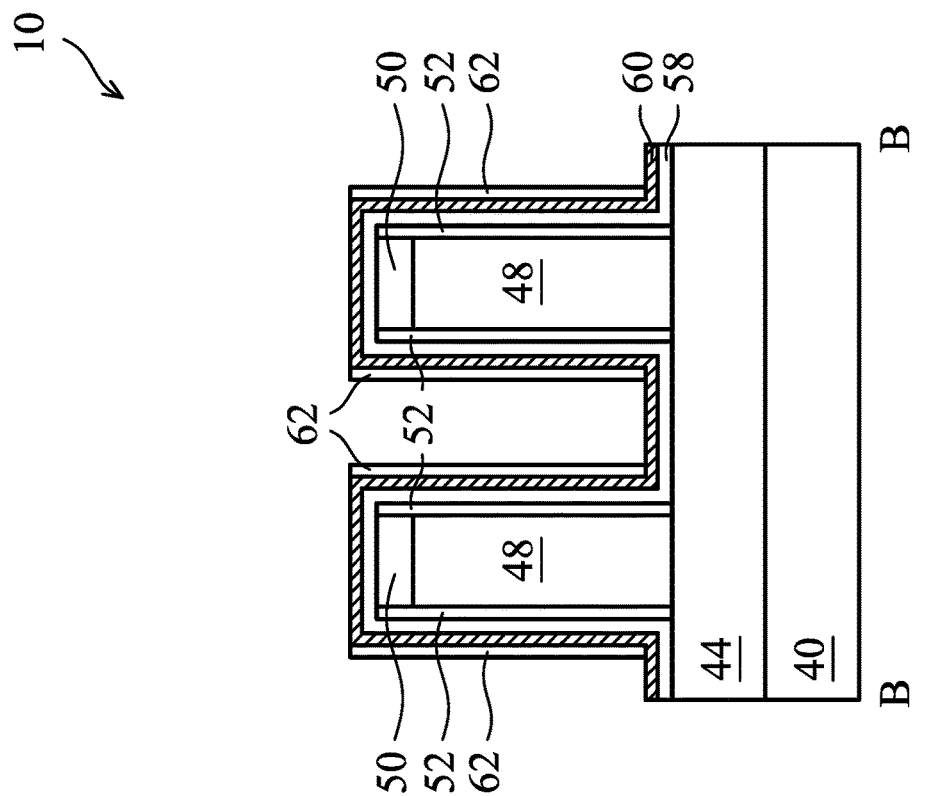
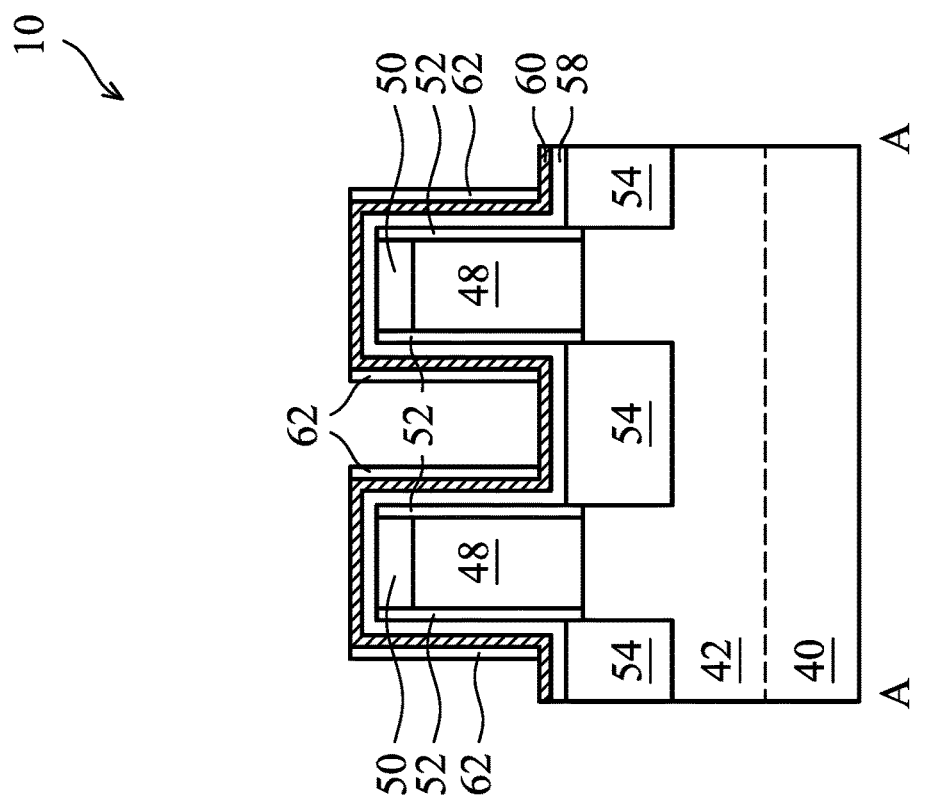

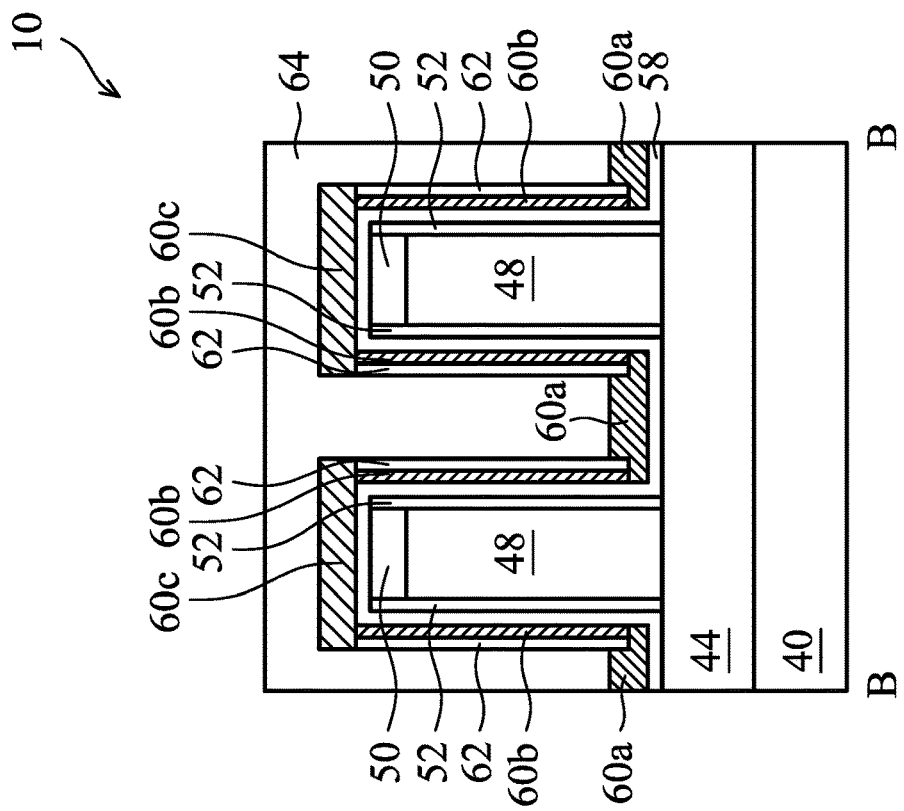
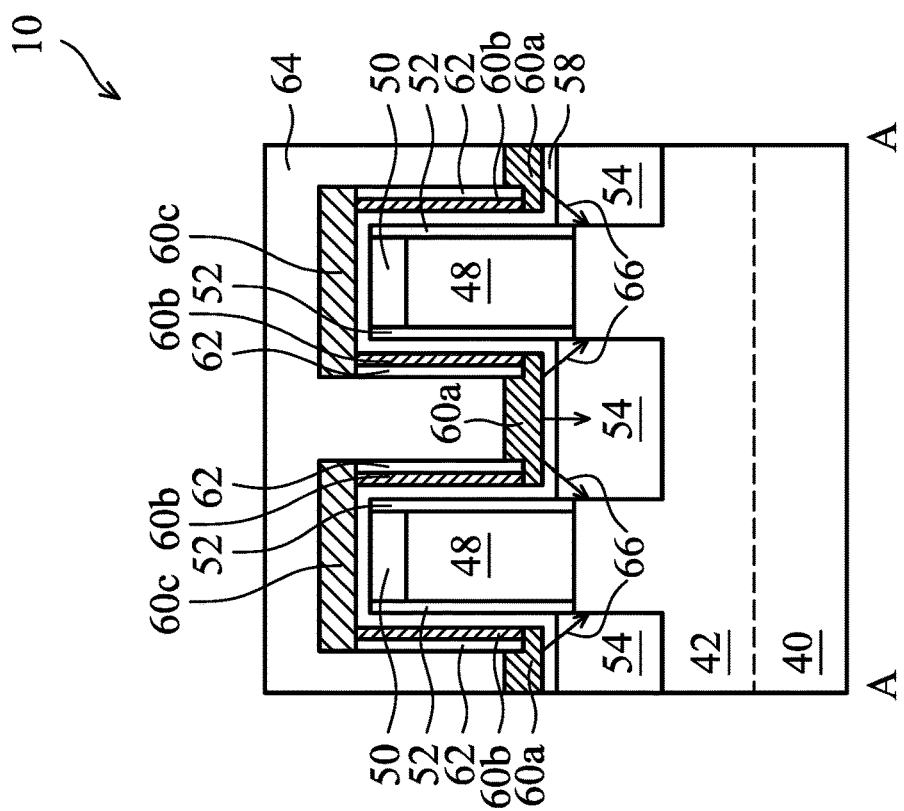
Fig. 9A
Fig. 9B

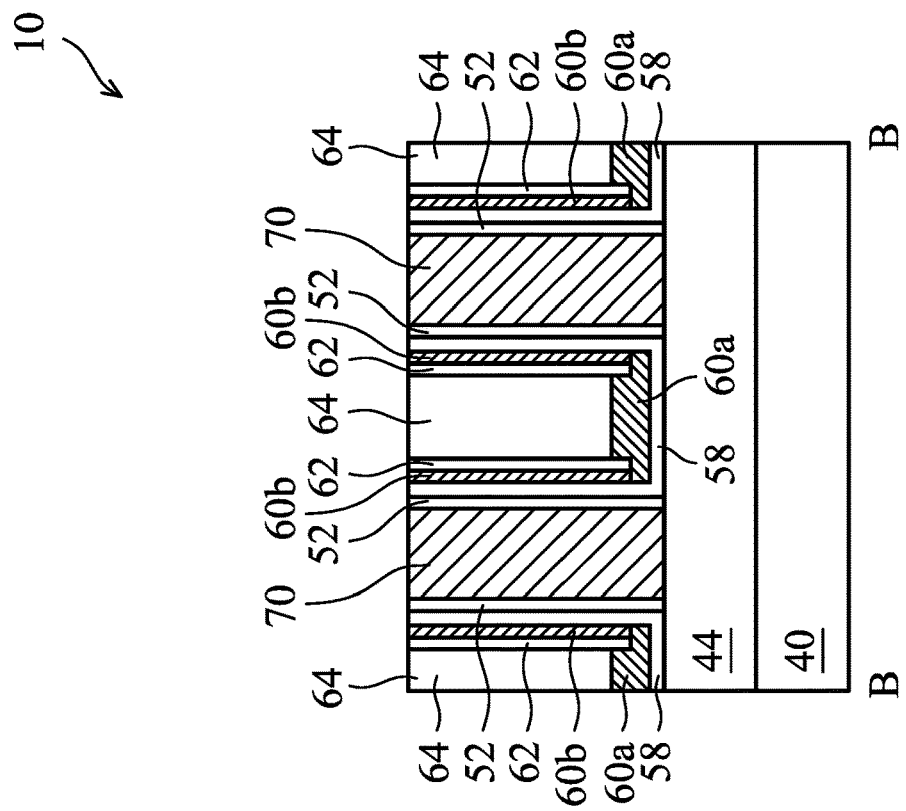
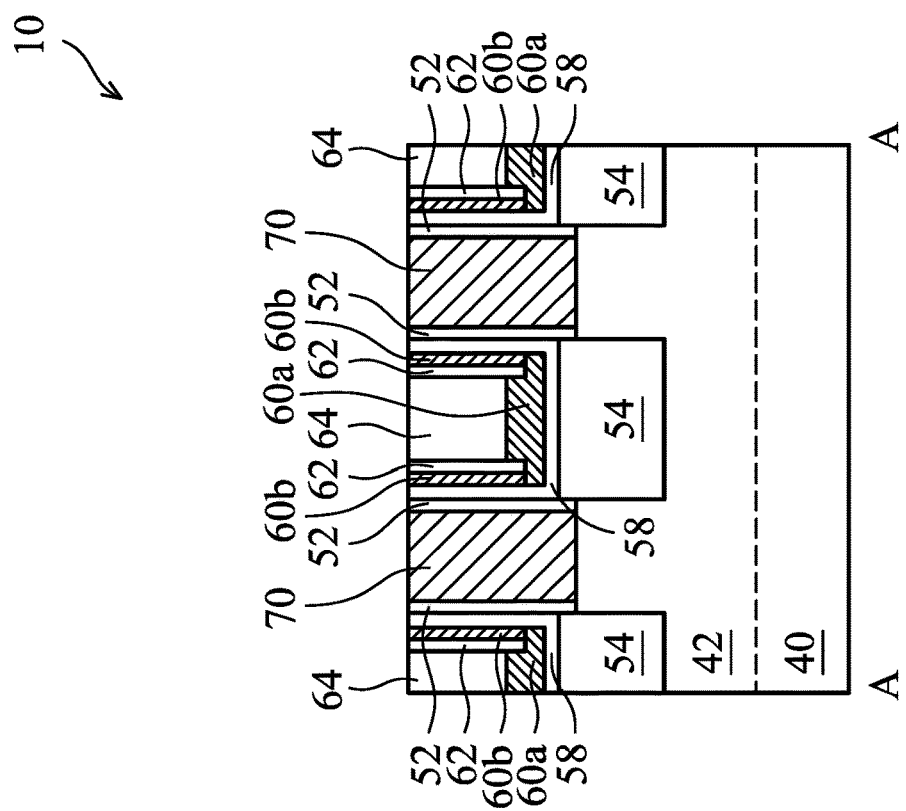
Fig. 10B
Fig. 10A

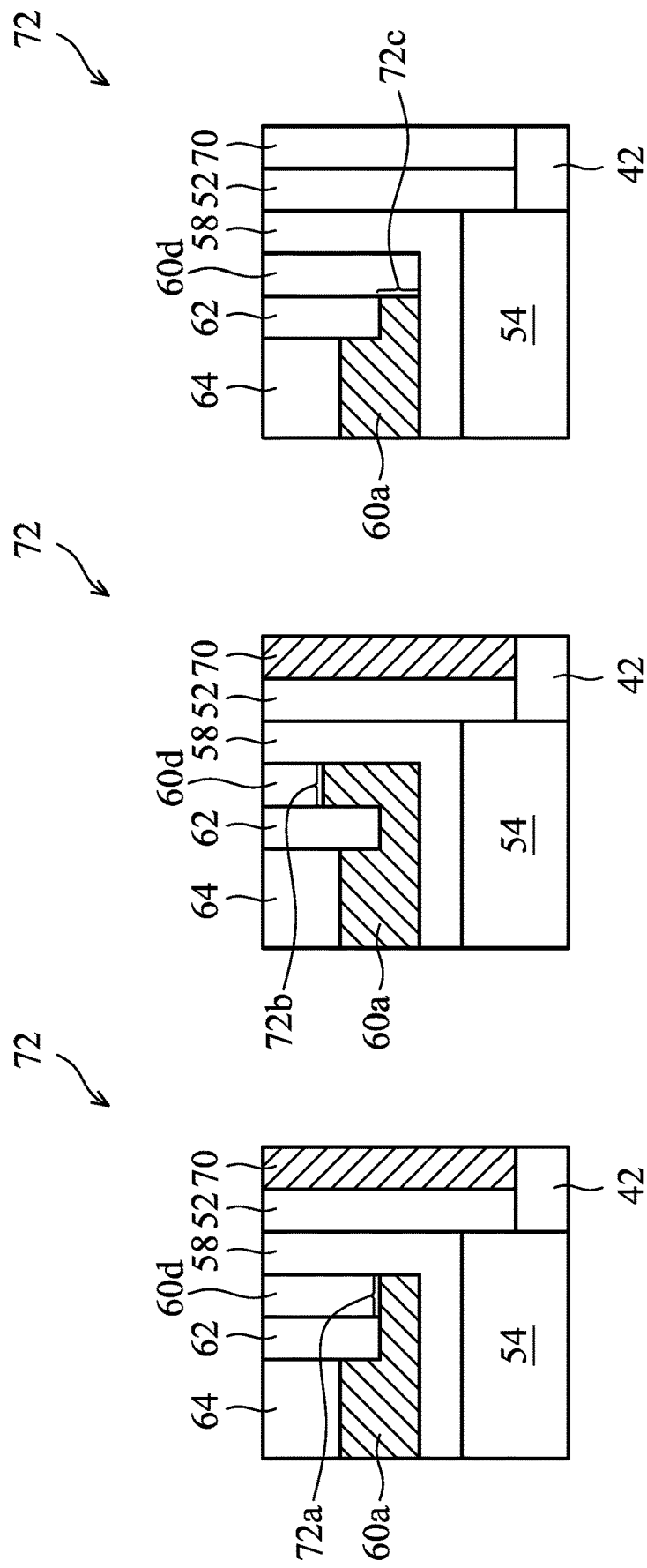

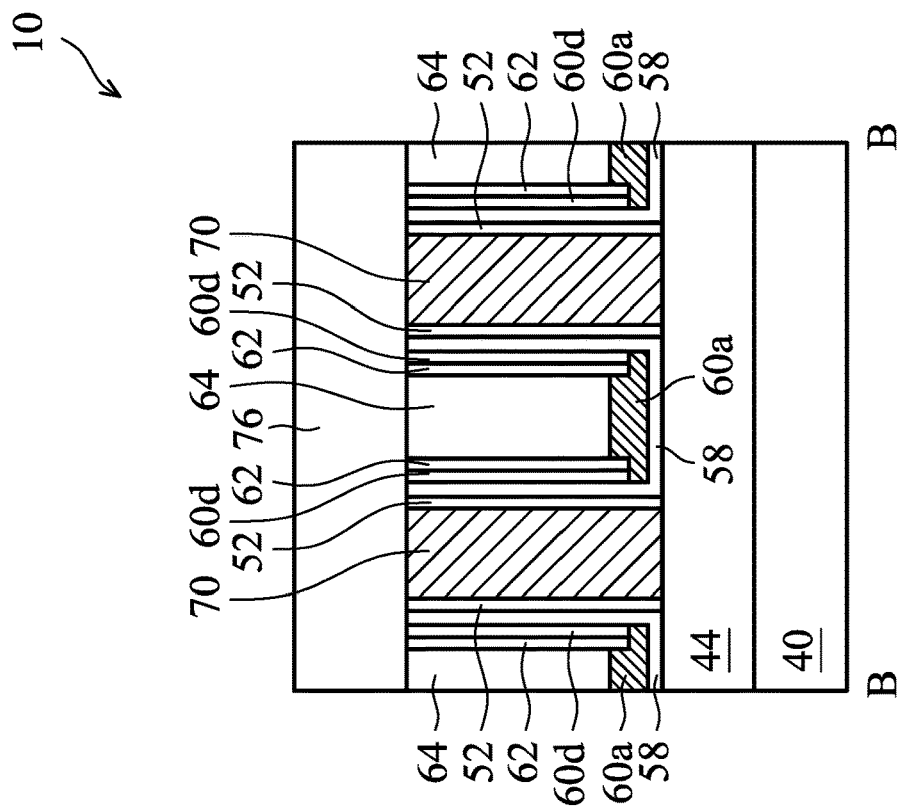
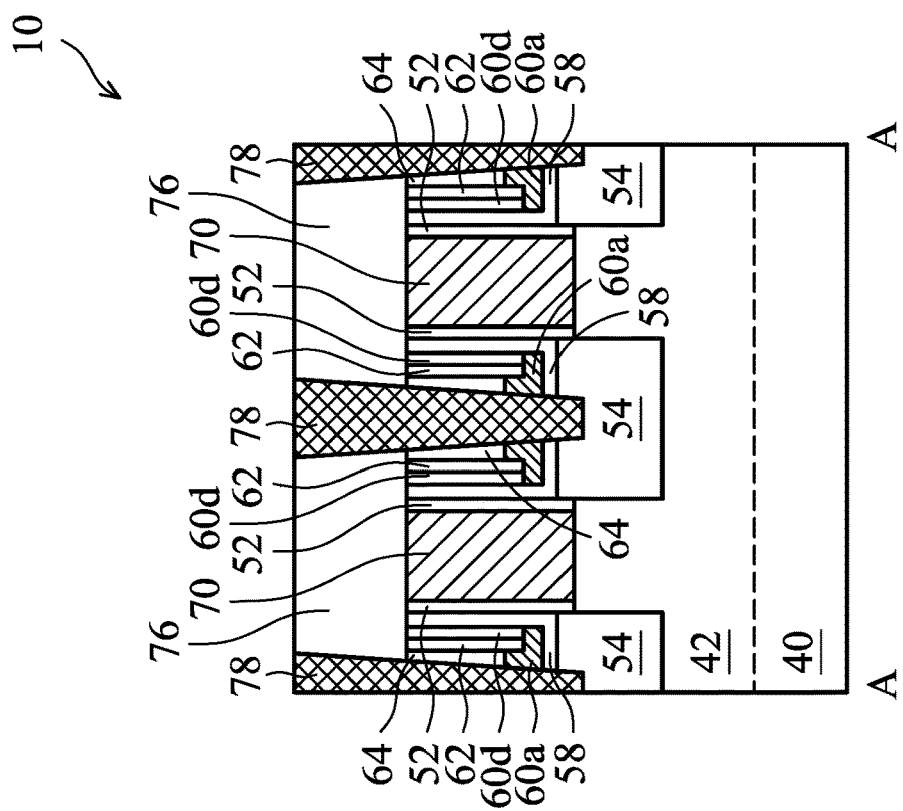
Fig. 12A
Fig. 12B

SEMICONDUCTOR DEVICE WITH AIR SPACER AND STRESS LINER

INCORPORATION BY REFERENCE

This present disclosure claims the benefit of priority to U.S. Provisional Application No. 62/738,834, "Semiconductor Device with Air Spacer and Stress Liner" filed on Sep. 28, 2018, which is incorporated by reference herein in its entirety.

BACKGROUND

In many applications, semiconductor field effect transistors (FETs) utilize strain engineering to achieve desired performance. In an example, mechanical strain can be induced within a semiconductor channel of an FET device by depositing of a stress liner as a blanket layer. As a result, carrier mobility can be increased within the semiconductor channel of the FET device. However, stress liners can cause deformation of gate structures of the FET device.

As dimensions of FET devices continue to be scaled down, parasitic capacitance resulting from the close proximity of conductive components can deteriorate performance of FET devices. Therefore, there is a need to mitigate the effects of parasitic capacitance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4A, 4B, 5A, 5B, 6A, 6B, 7A, 7B, 8A, 8B, 9A, 9B, 10A, 10B, 11A-11E, 12A, and 12B are cross-sectional views of a FinFET device at various stages of fabrication in accordance with some embodiments.

DETAILED DESCRIPTION

Figure 1:
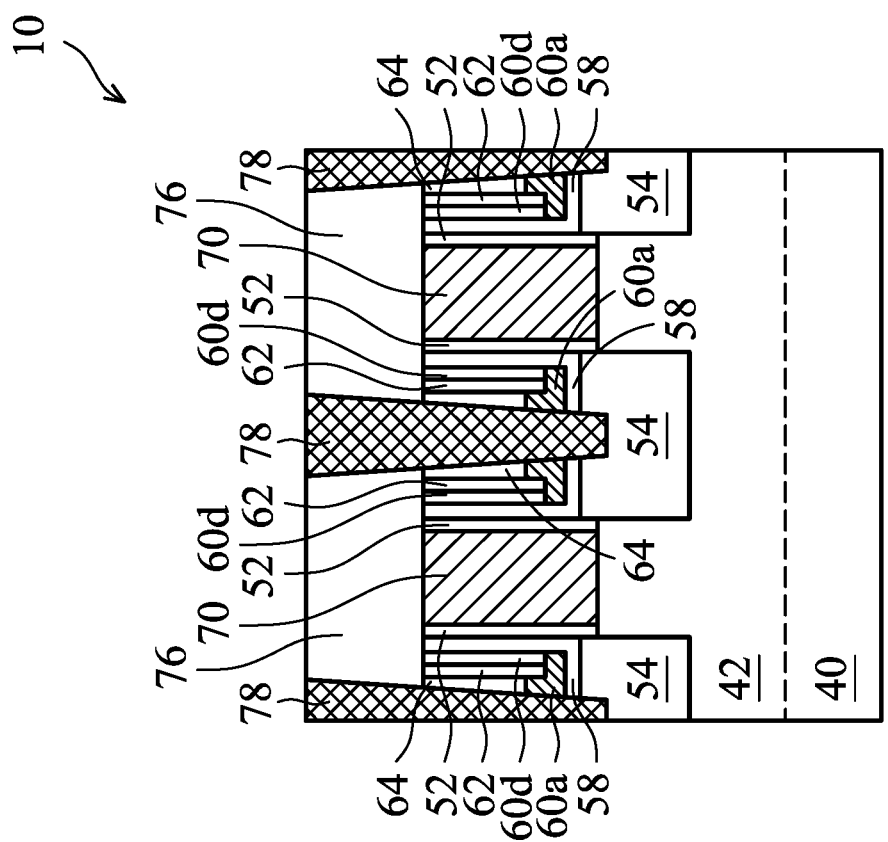
FIG. 1 is a cross-sectional view of a fin field effect transistor (FinFET) device in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "under", and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Aspects of the disclosure provide a semiconductor device fabrication method that is based on a same layer that is referred to as a pre-stress layer, to form a stress liner on source/drain regions and to form an air spacer along gate sidewalls in a semiconductor field effect transistor (FET) device (e.g., FinFET or planar FET). In some embodiments, the pre-stress layer is a silicon liner. In one example, the pre-stress liner is deposited to cover the sidewalls of a gate structure of the FET device, as well as the source/drain regions of the FET device. A protection layer, such as a silicon nitride layer, is subsequently formed over the pre-stress liner. The protection layer covers the sidewalls of the gate structure, while exposing the pre-stress liner at the source/drain regions. An oxygen-containing insulating layer, such as a layer of silicon dioxide, is then deposited over the substrate.

An annealing process is subsequently performed. Consequently, the portion of the pre-stress liner covering the source/drain regions is oxidized by receiving oxygen from the oxygen-containing insulating layer and is converted to a stress liner. For example, expansion of the stress liner caused by the oxidization reaction induces a compressive stress to the channel region of the FET device, which improves carrier mobility at the channel of the FET device during operation. In contrast, due to the protection layer, the portion of the pre-stress liner on the sidewalls of the gate structure is not oxidized. This portion of unoxidized pre-stress liner serves as a dummy layer, which is later removed to form the air spacer.

In a related fabrication process, a silicon liner is formed over a gate structure and source/drain regions of a FinFET device. The silicon liner is then oxidized to form a stress liner without protection on sidewalls of the gate structure. As a result, the stress liner induces compressive stresses to the channel region as well as the gate sidewalls of the FinFET device. The compressive stresses over the gate sidewalls deform the respective gate structure. In at least one example, this deformation becomes especially problematic for FinFET devices that typically have a gate structure with a large height-width aspect ratio.

For example, in a gate-last fabrication process, such deformation can reduce a top portion of the gate (e.g., dummy gate in gate-last fabrication process), due to the compressive stresses, and thus make it difficult to remove the dummy gate and later form a replacement gate. The fabrication method described herein solves the above deformation problem. In addition, using a single pre-stress liner to form both a stress liner and an air spacer can improve efficiency of the fabrication process.

FIG. 1 shows a cross-sectional view (taken along line A-A of FIG. 2) of a FinFET device 10 in accordance with an embodiment of the disclosure. The cross-sectional view is taken along a vertical plane crossing a fin 42 of the FinFET device 10. As described below, the FinFET device 10 is formed using a fabrication method that forms a stress liner and air spacer from a same pre-stress liner.

As shown specifically in the FIG. 1 example, the FinFET device 10 includes the fin 42 that extends upwardly from a substrate 40 and includes two FinFET transistors formed on the fin 42. The two FinFET transistors respectively include metal gates 70 that are arranged on the fin 42. The metal gates 70 have sidewalls that are covered by a spacer film 52. Further, source/drain regions 54 are formed at opposite sides of the metal gates 70 in the fin 42. The FinFET device 10 further includes a bottom contact etch stop layer (BCESL) 58 that covers both the source/drain regions 54 and the spacer film 52 on the sidewalls of the metal gates 70 to generally give the BCESL 58 a U-shape configuration, as shown in FIG. 1.

It is noted that the source/drain structures in the source/drain regions 54 are formed using epitaxial source/drain technology, and thus the top of the source/drain structures can be above the top of the fin 42 in some examples. For simplicity, the cross-sectional view of the source/drain structures is drawn using a rectangular shape, the cross-sectional view can be modified to use other suitable shape, such as hexagon shape, and the like for the source/drain structures.

A stress liner 60a can be arranged along a bottom portion of the U-shaped BCESL 58 in the source/drain regions 54. The stress liner 60a introduces a mechanical strain to a channel region below the respective metal gate 70. Further, a protection layer 62 can be positioned in parallel to sidewalls of the BCESL 58 and form an air gap 60d between the protection layer 62 and the BCESL 58. As shown, the protection layer 62 and air gap 60d are generally parallel to the sidewalls of the metal gate 70. The stress liner 60a and the air gap 60d are formed from a same pre-stress layer and are in connection with each other in some embodiments.

Dielectric layers, such as a bottom inter-layer dielectric (BILD) layer 64 and an upper inter-layer dielectric (UILD) layer 76 in the FIG. 1 example, are disposed over the FinFET transistors, such as over the source/drain regions 54 and metal gates 70 of FinFET transistors. Contact plugs 78 are disposed to form contacts with the source/drain regions 54, for example through the UILD layer 76, the BILD layer 64 and the like.

Figure 2:
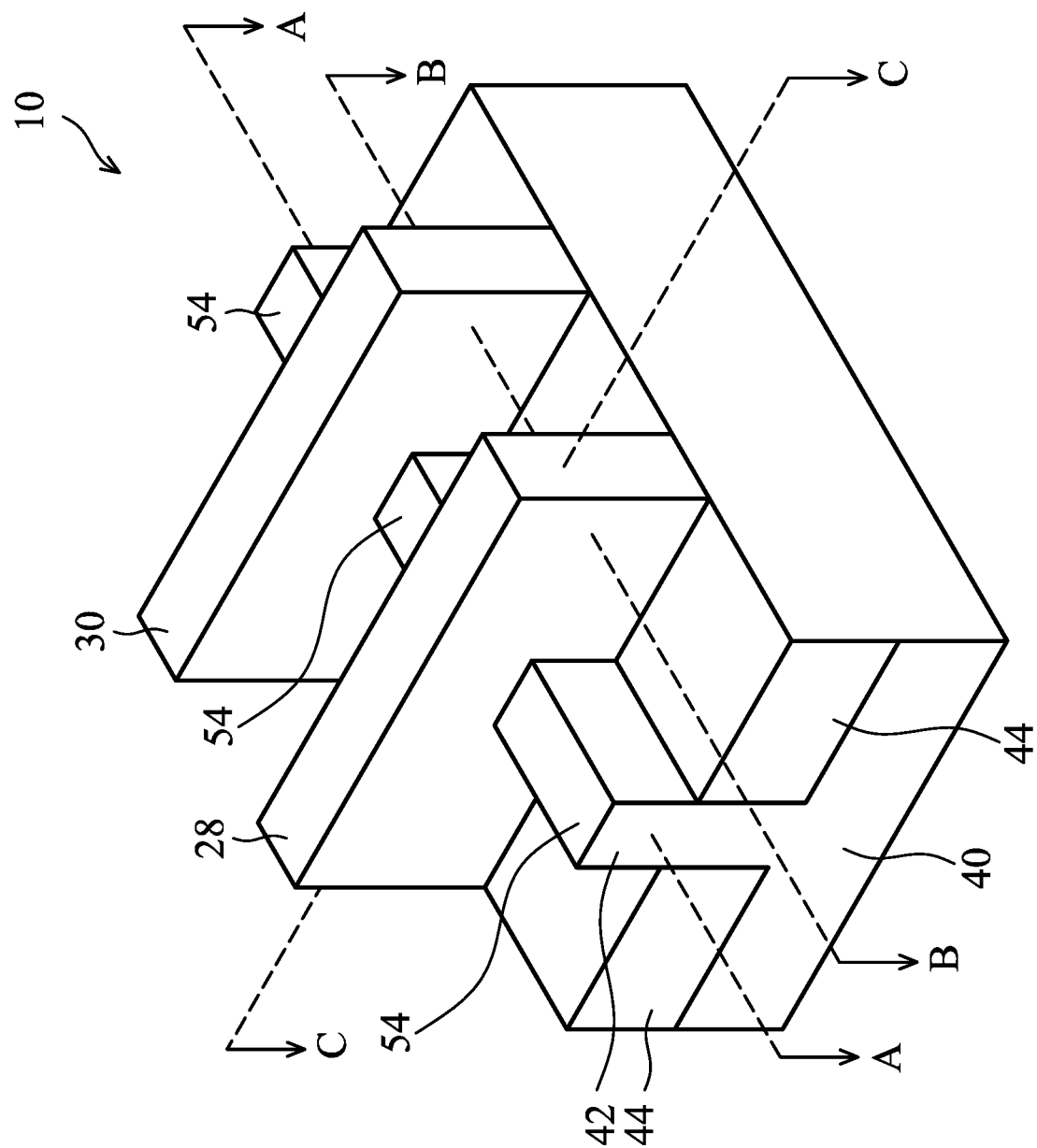
FIG. 2 is a perspective view of a FinFET structure in accordance with some embodiments.

FIG. 2 illustrates a perspective view of the FinFET device 10 during manufacturing, for example after forming gate structures or dummy gate structures on fins. As shown, the FinFET device 10 includes the substrate 40, the fin 42, and isolation regions 44. Similar to FIG. 1, the fin 42 extends upwardly from the substrate 40 and above the neighboring isolation regions 44. First and second gate structures 28 and 30 straddle the fin 42 and are perpendicular to the fin 42. The fin 42 includes source/drain regions 54 that are disposed at opposite sides of the gate structure 28 or 30.

FIG. 2 further illustrates locations of various cross-sectional views that are used as reference for other figures. For example, cross-section A-A is along a longitudinal axis of the fin 42 and in a direction of a current flow between the source/drain regions 54 during transistor operations. Cross-section B-B is parallel to the cross-section A-A, however, it crosses the gate structures 28 and 30 at a position above the isolation regions 44. Cross-section C-C is perpendicular to cross-section A-A and cuts through the gate structure 28 and a corresponding channel of the FinFET device 10.

Figure 3:
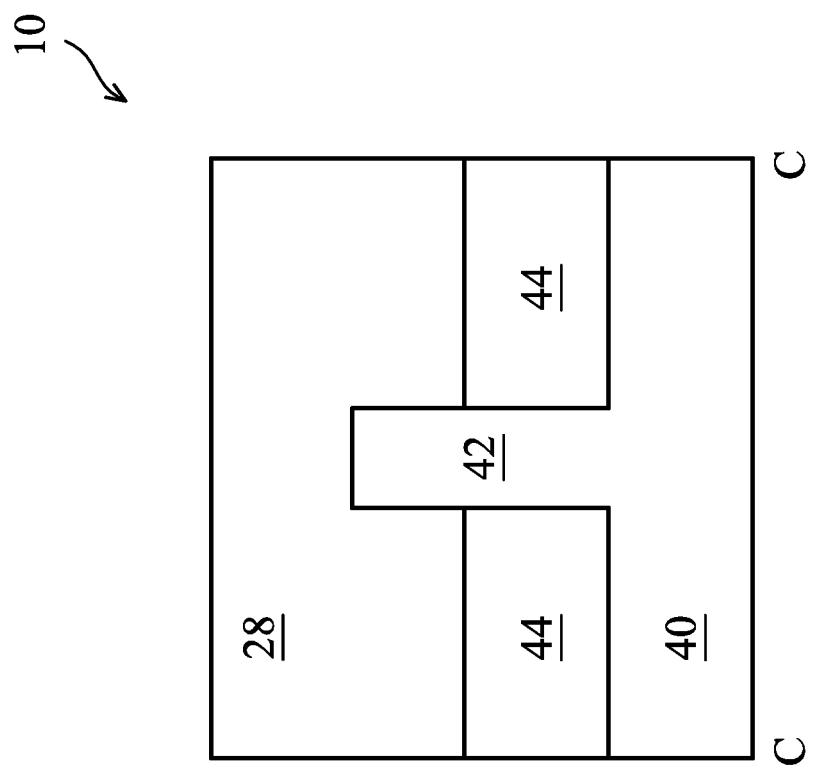

Example fabrication processes for forming FinFET devices are described with reference to FIGS. 3-12B. FIGS. 3-12B are cross-sectional views of intermediate stages in the formation of the FinFET devices. FIG. 3 corresponds to the reference cross-section C-C illustrated in FIG. 2. FIGS. 4A, 5A, 6A, 7A, 8A, 9A, 10A, 11A, 11C, 11D, 11E, and 12A correspond to the reference cross-section A-A. FIGS. 4B, 5B, 6B, 7B, 8B, 9B, 10B, 11B, and 12B correspond to the reference cross section B-B.

FIG. 3 shows a cross-sectional view of the FinFET device 10 along the C-C line shown in FIG. 2 at an intermediate stage of the fabrication process, such as a fin formation stage. In FIG. 3, the fin 42 is formed on the substrate 40 between the two isolation regions 44. In an embodiment, the substrate 40 is a semiconductor substrate, such as a bulk semiconductor substrate, a semiconductor-on-insulator (SOI) substrate, a multi-layered or gradient substrate, or the like. The substrate 40 includes a semiconductor material, such as an elemental semiconductor including Si and Ge; a compound or alloy semiconductor including SiC, SiGe, GaAs, GaP, GaAsP, AlInAs, AlGaAs, GaInAs, InAs, GaInP, InP, InSb, and/or GaInAsP; or a combination thereof. The substrate 40 may be doped or un-doped. In a specific example, the substrate 40 is a bulk silicon substrate.

In one example, the fin 42 is formed by first etching trenches in the substrate 40. For example, a hardmask layer is formed on the substrate 40. In an embodiment, the hardmask layer includes silicon carbon nitride (SiCN), silicon nitride (SiN), silicon oxycarbonitride (SiOCN), silicon oxynitride (SiON), and the like, or a combination thereof deposited by chemical vapor deposition (CVD) or the like. In some examples, the hardmask layer has a thickness ranging from approximately 20 nm to approximately 160 nm.

The hardmask layer is patterned to form a mask by using any suitable photolithography and etching process, such as a reactive ion etch (RIE), a neutral beam etch (NBE), or the like. In some examples, spacer patterning (e.g., self-aligned double patterning (SADP) and/or self-aligned quadruple patterning (SAQP)) is used to pattern the hardmask. Using the pattered hardmask, the substrate 40 is etched to form the fin 42. In various examples, the etching process may use any suitable etching technology, such as RIE, NBE, or the like. A plurality of fins (not shown) parallel with the fin 42 are formed at either side of the fin 42 in a way similar to the fin 42 on the substrate 40. The etching forms trenches between the fins. It will be appreciated that the fins may or may not have sidewalls that are entirely vertical. In some examples, the bottoms of the fins are in fact larger in width than the top portions thereof.

The trenches are filled with an insulation material. In some examples, the insulation material is an oxide, such as silicon oxide, a nitride, and the like, or a combination thereof. The insulation material is formed by a high density plasma chemical vapor deposition (HDP-CVD), a flowable CVD (FCVD) (e.g., a CVD-based material deposition in a remote plasma system and post curing to make it convert to another material, such as an oxide), and the like, or a combination thereof. Other insulation materials formed by any suitable process may be used. An anneal process is performed once the insulation material is formed. Further, in some examples, a planarization process, such as a chemical mechanical polishing/planarization (CMP), is performed to remove any excess insulation material.

The insulation material is then recessed to form the isolation regions 44, which may be referred to as shallow trench isolation (STI) regions, and to cause the fin 42 to protrude from between neighboring isolation regions 44. The insulation material is recessed using any applicable etching process, such as one that is selective to the material of the insulation material. For example, the recessing process includes a dry etching process, a wet etching process, and/or a combination thereof. For example, the recessing process includes a dry, plasma-free process using a reaction gas or reaction gas combination, such as HF+NH$_3$, or plasma process, using a reaction gas or a reaction gas combination, such as NF3+NH$_3$, and/or other suitable reaction gases.

In other examples, the recessing process includes a wet etch performed using a dilute mixture of HF (e.g., 49% HF in H$_2$O by weight) and de-ionized (DI) H$_2$O, where the HF:H$_2$O ratio is approximately 1:50 or approximately 1:100. In some embodiments, a recessing depth is controlled (e.g., by controlling an etching time) so as to result in a desired height of an exposed upper portion of the fin 42. In some examples, the fin height (the exposed upper portion of the fin 42) ranges from approximately 20 nm to approximately 40 nm. In some examples, the fin height ranges from approximately 40 nm to approximately 100 nm.

The process described with reference to FIG. 3 is just one example of how fins may be formed. In other embodiments, a dielectric layer is formed over a top surface of the substrate 40; trenches are etched through the dielectric layer; epitaxial fins are epitaxially grown in the trenches; and the dielectric layer is recessed such that the homoepitaxial and/or heteroepitaxial structures protrude from the dielectric layer to form epitaxial fins. It may be advantageous to epitaxially grow a material or epitaxial fin structure for n-type FinFETs different from the material or epitaxial fin structure for p-type FinFETs.

After the formation of the fin 42 and the isolation regions 44, the gate structure 28 (e.g., a dummy gate) is subsequently formed over the fin 42 and the isolation region 44 as shown in FIG. 3. Examples of fabrication of the gate structure 28 are described below with reference to FIGS. 4A-4B.

FIG. 4A shows a cross-sectional view of the FinFET device 10 along the A-A line shown in FIG. 2 and FIG. 4B shows a cross-sectional view of the FinFET device 10 along the B-B in the FIG. 2 after source/drain formation. In FIGS. 4A-4B, dummy gates 48 with masks 50, gate spacers 52, and source/drain regions 54 are formed. For example, a dummy dielectric layer is first conformally formed on the surface of structures over the substrate 40, including the fin 42 and the isolation regions 44. In various examples, the dummy dielectric layer includes silicon oxide, silicon nitride, a combination thereof, or the like, and is deposited or thermally grown according to applicable techniques, such as CVD, thermal oxidation, or the like.

Subsequently, a dummy gate layer is formed over the dummy dielectric layer. In an embodiment, the dummy gate layer is deposited, such as by using CVD or the like, over the dummy dielectric layer and then planarized, such as by a CMP. The dummy gate layer includes, for example, polysilicon, although other materials that have a high etching selectivity may also be used. A mask layer is then formed over the dummy gate layer. The mask layer is deposited, such as by using CVD or the like, over the dummy gate layer in one example. In accordance with some embodiments, the mask layer is formed of silicon oxide, silicon oxycarbonitride, silicon nitride, or the like. In some examples, a multiple-layer hardmask (e.g., SiO$_2$+SiN, SiN+SiO$_2$, and the like) is used.

Thereafter, the mask layer is patterned using applicable photolithography (e.g., standard lithographic process, EUV lithographic process, SADP, SAQP, or a combination of these techniques) and etching techniques to form the masks 50. Further, the dummy gate layer and dummy dielectric layer are patterned, such as by transferring the pattern of the masks 50, and by using an applicable etching technique to form the dummy gates 48. Each dummy gate 48 includes portions of the dummy gate layer and the dummy dielectric layer. In some embodiments, the etching includes an anisotropic etching, such as RIE, NBE, or the like. Portions of the fin 42 overlapped by the dummy gates 48 correspond to channel regions. For simplicity, the portions of the fine 42 that are not overlapped with the dummy gates 48 are referred to as source/drain regions 54.

The resulting dummy gates 48 cross the fin 42 and each straddle a respective channel region of the fin 42 and extend in the C-C line direction over the isolation regions 44 (in FIG. 2, not shown in FIG. 3). The resulting dummy gates 48 will be replaced with replacement gates at a later processing stage in the formation of the FinFET devices. For example, the dummy gates 48 can be replaced at a later processing stage by a high-K dielectric layer (HK) and metal gate materials. Such a fabrication process of replacing a dummy gate with a replacement gate is known as a gate-last process.

While embodiments are described herein using a gate-last process as a non-limiting example, it will be understood that embodiments of the present disclosure are not limited to such a process. In some embodiments, various aspects of the present disclosure are applicable to a gate-first process. In some examples, a gate-first process includes formation of a gate prior to source/drain formation or source/drain dopant activation. In some examples, a gate-first process includes gate dielectric and metal gate depositions over the isolation regions 44 and the fin 42, followed by a gate etch process to define a gate critical dimension (CD). In some embodiments of a gate-first process, gate formation is followed by source/drain formation including doping of source/drain regions and, in some examples, annealing for source/drain dopant activation.

Although not specifically illustrated, implants for lightly doped source/drain (LDD) regions are performed in some examples. For a p-type or n-type device, p-type or n-type impurities are implanted into the exposed portions of the fin 42, respectively. The p-type impurities include boron, BF$_2$, or the like, and the n-type impurities include phosphorus, arsenic, or the like, in accordance with some embodiments. An anneal process is used to activate the implanted impurities.

The spacers 52 are subsequently formed on sidewalls of each gate structure (including the dummy gate 48 and the mask 50). The spacers 52 can be formed of an appropriate dielectric material, such as a low-k dielectric layer that has a dielectric constant (k) value less than 3.9, which may further be less than 2.0 in an example. In some embodiments, the spacers 52 include a dielectric material such as silicon nitride, silicon carbide, combinations thereof, or any other low-k materials. In some embodiments, the spacers 52 include a material that does not include oxygen. Accordingly, in some examples, a portion of a pre-stress liner formed adjacent to the spacers 52 would less likely be oxidized in a later annealing process by obtaining oxygen from the spacers 52. In some other embodiments, the spacers 52 include a material that includes oxygen. Accordingly, in some examples, an isolation layer (e.g., a BCESL) is formed adjacent to the spacers 52 and between a pre-stress liner and the spacers 52 to prevent the pre-stress liner from obtaining oxygen from the spacers 52 during a later annealing process.

In some embodiments, each spacer 52 includes a multi-layer structure, including for example main spacer walls, liner layers, and the like.

In some examples, the spacers 52 are formed using deposition and etching processes. For example, the spacers 52 are formed by conformally depositing, such as by CVD or the like, a dielectric material over the fins 42, the isolation region 44, and top and sidewalls of the gate structures each including the dummy gate 48 and the mask 50. An anisotropical etch is subsequently performed to etch back the dielectric material, for example in a vertical direction to the substrate 40. When the dielectric material over, for example, the top of the gate structures is etched away, the dielectric material remains on the sidewalls. Remaining parts of the dielectric material on the sidewalls of the gate structure form the spacers 52. In some embodiments, the etch-back process (e.g., for spacer formation) includes a multiple-step etching process to improve etch selectivity and to provide over-etch control.

In some embodiments, epitaxial source/drain structures are formed in the source/drain regions 54 based on the fin 42 at opposite sides of the dummy gates 48. For example, an etching selective to the material(s) of the fin 42 is first performed. The etching process can be performed any applicable etching technique, such as a dry or wet etch, which is anisotropic or isotropic. In some embodiments, the etching process includes a dry etch using an F-based gas, Cl-based gas, or the like. The etching process etches into exposed portions of the fin 42 that correspond to the source/drain regions 54. The source/drain regions 54 are then epitaxially grown on the fin 42 at opposite sides of each dummy gate 48 to form the epitaxial source/drain structures. In some examples, the epitaxial growth uses Metal-Organic Chemical Vapor Deposition (MOCVD), Molecular Beam Epitaxy (MBE), Liquid Phase Epitaxial (LPE), Vapor Phase Epitaxial (VPE), the like, or a combination thereof.

The epitaxial source/drain structures at the source/drain regions 54 include any suitable materials appropriate for the device types. For example, the epitaxial source/drain structures for an n-type device includes silicon, SiP, SiC, SiCP, the like, or a combination thereof. For example, the epitaxial source/drain structures for a p-type device include SiGe, SiGeB, Ge, GeSn, or the like. In some embodiments, the source/drain regions 54 are in-situ doped during the epitaxial growth process, or an implantation process is performed to dope the source/drain regions 54.

In some embodiments, the epitaxial source/drain structures in the source/drain regions 54 each have a pentagon shape or a pentagon-like shape, and embodiments are not limited thereto. In addition, the epitaxial source/drain structures in the source/drain regions 54 each may or may not have a facet. The source/drain structures can have any suitable shape. Simple elevated epitaxial source/drain structures are shown as example, can be modified for other shapes.

FIG. 5A shows a cross-sectional view of the FinFET device 10 along the A-A line shown in FIG. 2 and FIG. 5B shows a cross-sectional view of the FinFET device 10 along the B-B in the FIG. 2 after BCESL formation. In FIGS. 5A-5B, a BCESL 58 is formed over the resulting structure from FIGS. 4A-4B. In one embodiment, the BCESL 58 is conformally formed on surfaces of the source/drain regions 54, the spacers 52, the masks 50, and the isolation regions 44. In some embodiments, the BCESL 58 includes silicon nitride, silicon carbonitride, or the like, formed using atomic layer deposition (ALD), CVD, the like, or a combination thereof.

FIG. 6A shows a cross-sectional view of the FinFET device 10 along the A-A line shown in FIG. 2 and FIG. 6B shows a cross-sectional view of the FinFET device 10 along the B-B in the FIG. 2 after pre-stress liner formation. In FIGS. 6A-6B, a pre-stress liner 60 is formed over the resulting structure from FIGS. 5A-5B. In an embodiment, the pre-stress liner 60 is conformally formed extending along and covering the BCESL 58 at the source/drain regions 54, the isolation regions 44, and the sidewalls and the tops of gate structures 48/50/52 (that each includes the dummy gate 48, the mask 50, and a pair of spacers 52). The pre-stress liner 60 includes a material that expands in volume if oxidized. For example, when a material having a first thickness is oxidized, the resulting oxide has a second thickness that is greater than the first thickness.

In some embodiments, a material expanding in volume by an oxidization reaction can be one of various semiconductor or conductor materials, such as silicon, silicon germanium, germanium, aluminum, and the like. In some examples, the pre-stress liner 60 includes at least one of silicon, germanium, silicon germanium, aluminum. In an example, the pre-stress liner 60 includes silicon in the form of polysilicon. In another example, the pre-stress liner 60 includes silicon in the form of amorphous silicon. The pre-stress liner 60 is formed by using, for example, ALD, in one example, but embodiments are not limited thereto. In some examples, the thickness of the pre-stress liner 60 ranges from about 1 nm to 10 nm. Of course, depending on fabrication technologies employed for fabricating various types of FinFET devices, thickness of the pre-stress liner 60 can vary and may be in a range different from the above range.

In some embodiments, the pre-stress liner 60 is formed in first regions of the substrate 40 containing P-type devices (e.g., the regions shown in FIGS. 6A-6B), but not formed in second regions of the substrate 40 (not shown in FIGS. 6A-6B) containing N-type devices. For example, after forming of the pre-stress liner 60 over the substrate 40, a mask is formed in the first regions covering the pre-stress liner 60 while exposing the pre-stress liner 60 in the second regions. The pre-stress liner 60 in the second regions is then removed followed by removing the mask at the first regions.

FIG. 7A shows a cross-sectional view of the FinFET device 10 along the A-A line shown in FIG. 2 and FIG. 7B shows a cross-sectional view of the FinFET device 10 along the B-B in the FIG. 2 after a formation of protection layers. In FIGS. 7A-7B, protection layers 62 are formed on the sidewalls of the gate structures 48/50/52 that each includes the dummy gate 48, the mask 50, and the pair of spacers 52. The protection layer 62 is formed to selectively cover a first portion of the pre-stress liner 60 that is formed along the sidewalls of the gate structures, and not to cover a second portion other than the first portion. The protection layer 62 later protects the first portion of the pre-stress liner 60 from being oxidized during a later annealing process. In contrast, the second portion of the pre-stress liner 60, such as a portion above the source/drain regions 54 and the like, is not covered by the protection layer 62. In some embodiments, the second portion of the pre-stress liner 60 includes the portion conformally formed at the source/drain regions 54, or over the isolation regions 44, and the tops of the gate structures 48/50/52.

In some embodiments, the protection layer 62 includes a dielectric material such as silicon nitride, silicon carbide, or combinations thereof. In some embodiments, the protection layer 62 includes a multi-layer structure. In some embodiments, the protection layer 62 is formed by conformally depositing, such as by CVD or the like, a dielectric material extending and covering the pre-stress liner 60 and a subsequent anisotropical etching to etch back the dielectric material. Remaining parts of the dielectric material on the sidewalls of the gate structures 48/50/52 (that each includes the dummy gate 48, the mask 50, and the spacers 52) form the protection layer 62.

In some embodiments, the etch-back process (e.g., for protection layer formation) includes a multiple-step etching process to improve etch selectivity and provide over-etch control. In some examples, the thickness of the protection layers 62 ranges from about 1 nm to 20 nm. Of course, depending on fabrication technologies employed for fabricating various types of FinFET devices, a thickness of the protection layer 62 can vary and may be in a range different from the above range.

Figure 8B:
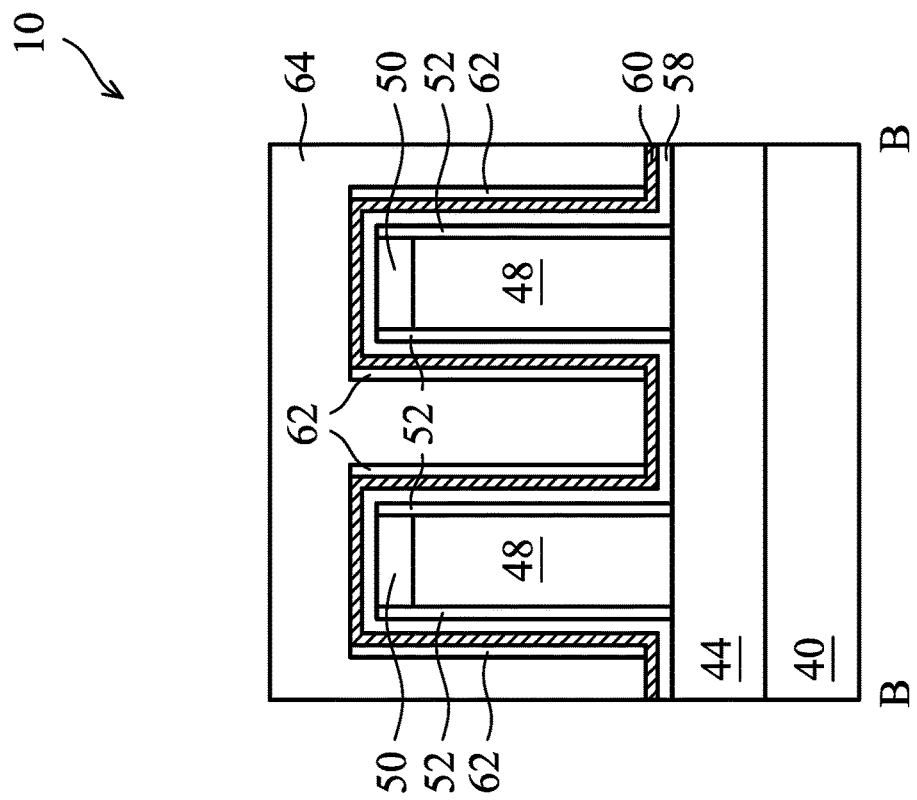
Figure 8A:
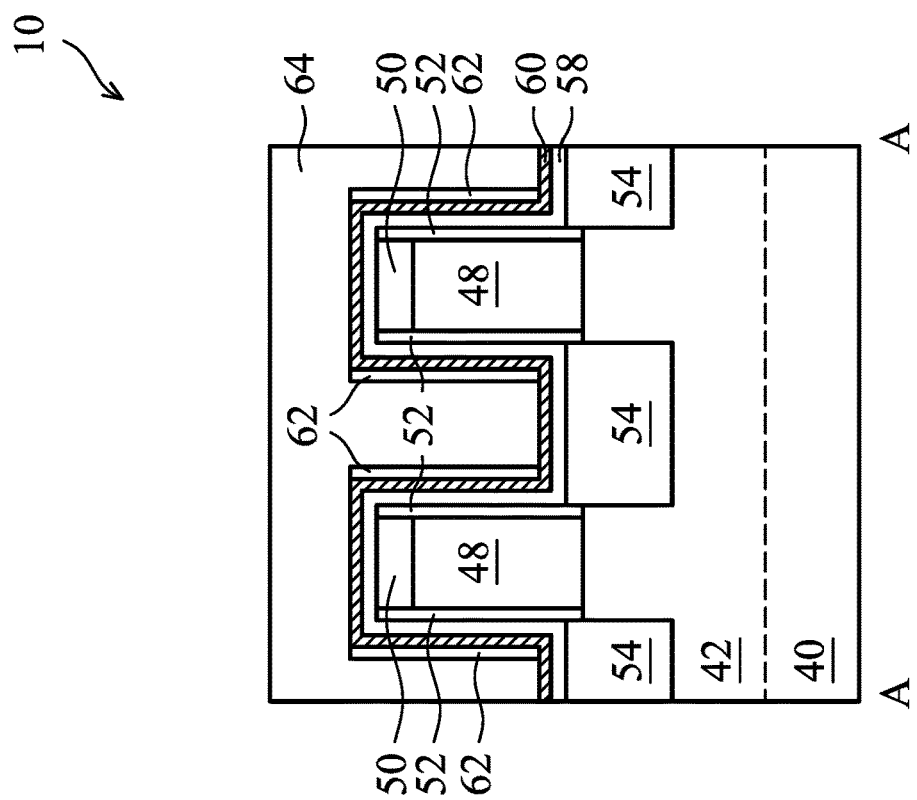

FIG. 8A shows a cross-sectional view of the FinFET device 10 along the A-A line shown in FIG. 2 and FIG. 8B shows a cross-sectional view of the FinFET device 10 along the B-B in the FIG. 2 after a formation of an inter-layer dielectric layer. In FIGS. 8A-8B, a bottom inter-layer dielectric (BILD) layer 64 is formed over the substrate 40, such that the resulting structures from FIGS. 7A-7B, such as the structures over the substrate 40 (e.g., the fin 42, the gate structures 48/50/52, and the layers of 58/60/62) are buried in the BILD layer 64. In one example, the second portion of the pre-stress liner 60 that is not covered by the protection layer 62 is in contact with the BILD layer 64, while the first portion of the pre-stress liner 60 that is covered by the protection layer 62 is separated from the BILD layer 64 due to protection of the protection layer 62.

In some other examples, it is possible that an additional layer (not shown in FIGS. 8A-B) is formed on the second portion of the pre-stress liner 60 for various purposes such that the second portion of the pre-stress liner 60 is not directly in contact with the BILD layer 64. As an example, the additional layer includes oxygen, and conformally deposited over the substrate 40 before the formation of the BILD layer 64. Under such arrangement, the additional layer provides oxygen for a later oxidization process instead of the BILD layer 64.

The BILD layer 64 is formed with materials including oxygen in some embodiments. In some examples, the BILD layer 64 includes phospho-silicate glass (PSG), boro-silicate glass (BSG), boron-doped phospho-silicate glass (BPSG), undoped silicate glass (USG), fused silica galss (FSG), tetraethyl orthosilicate (TEOS) oxide, or the like. In some examples, the BILD layer 64 includes silicon oxide, silicon oxynitride, and the like. In some embodiments, the BILD layer 64 may include a single layer or multiple layers. The BILD layer 64 is deposited by any suitable method, such as CVD, plasma-enhanced CVD (PECVD), FCVD, the like, or a combination thereof. In some other examples, an additional layer including oxygen is formed before the BILD, as described above, and accordingly the BILD is formed with a material with or without oxygen.

FIG. 9A shows a cross-sectional view of the FinFET device 10 along the A-A line shown in FIG. 2 and FIG. 9B shows a cross-sectional view of the FinFET device 10 along the B-B in the FIG. 2 after an annealing process. In FIGS. 9A-9B, an annealing process is performed. For example, the annealing process is performed at a temperature ranging from about 300° C. to 1200° C., and last for about 5 minutes to 5 hours. Depending on fabrication technologies employed for fabricating various types of FinFET devices, time and/or temperatures of the annealing process can vary and may be in a range different from the above range. As a result of the annealing process, the second portion of the pre-stress liner 60 is oxidized by receiving oxygen supplied from the BILD, and expands in volume.

In an embodiment, the oxidized second portion of the pre-stress liner 60 includes two parts: a first part, referred to as a stress liner 60a, extending along a profile of the fin 42 at the source/drain regions 54, and over the tops of isolation regions 44 beside the gate structures 48/50/52; and a second part, referred to as a top oxidization layer 60c, over the tops of the gate structures 48/50/52. As shown, the stress liner 60a and the top oxidization layer 60c have thicknesses greater than that of the pre-stress liner 60. As a result, compressive stresses, as indicated by arrows 66, are introduced to the channel regions defined by the gate structures 48/50/52.

In contrast, all or a majority of the first portion of the pre-stress liner 60, also referred to as dummy spacers 60b, separated from the BILD layer 64 by the protection layer 62, is not oxidized due to the protection of the protection layer 62. As a result, no lateral stresses are imposed on the sidewalls of the gate structures 48/50/52.

FIG. 10A shows a cross-sectional view of the FinFET device 10 along the A-A line shown in FIG. 2 and FIG. 10B shows a cross-sectional view of the FinFET device 10 along the B-B in the FIG. 2 after a formation of replacement gates. In FIGS. 10A-10B, replacement gates 70 are formed to replace the dummy gates 48. In some embodiments, a planarization process, such as a CMP, is performed to level the top surface of BILD layer 64 with the top surface of the dummy gate 48. The CMP also removes the top oxidization layers 60c, and the masks 50 from over the dummy gate 48. Top surfaces of the structures 52/58/60b/62 are also levelled with the top surface of the dummy gates 48. Accordingly, top surfaces of the dummy gates 48 are exposed through the BILD layer 64.

The dummy gates 48 are subsequently removed, such that openings through the BILD layer 64 and defined by the pairs of the spacers 52 are formed across the fin 42. The opening exposes the channel region of the fin 42, for example. The removal of the dummy gates 48 uses an etching process selective to the materials of the dummy gates 48. The etching process may be a dry or wet etching process.

The replacement gates 70 are then formed in the openings between the pairs of the spacers 52. In some embodiments, each replacement gate 70 includes a multi-layer structure, including for example an interfacial layer, a gate dielectric layer, and a gate conductive layer. The interfacial layer is formed over surfaces of the channel regions of the fin 42. The gate dielectric layer is formed over the interfacial layer and sidewall surfaces of the spacers 52. The gate conductive layer is formed over the gate dielectric layer. The formation of the replacement gates 70 includes depositions to form layers of various materials, and one or more CMP processes to remove excessive materials and thereby planarize a top surface of the respective FinFET device.

In various embodiments, the interfacial layer of the replacement gate stack includes a dielectric material such as silicon oxide ($SiO_2$), HfSiO, or silicon oxynitride (SiON). The interfacial layer is formed by chemical oxidation, thermal oxidation, atomic layer deposition (ALD), chemical vapor deposition (CVD), and/or other suitable method. The interfacial layer acts as a glue/buffer layer.

In various embodiments, the gate dielectric layer of the replacement gate is formed of silicon dioxide, silicon nitride, a high-k dielectric material having a k value greater than, for example, about 7.0, or other suitable dielectric. In some embodiments, the high-K dielectric material includes hafnium oxide (HfO2). In some other exmaples, the high-K dielectric material includes other high-K dielectrics, such as $TiO_2$, HfZrO, $Ta_2O_3$, $HfSiO_4$, $ZrO_2$, ZrSiO2, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable materials.

The high-K gate dielectric material is formed by ALD, physical vapor deposition (PVD), CVD, oxidation, and/or other suitable methods.

The gate conductive layer serves as a transistor (e.g., FinFET) gate electrode, and includes a single layer or a multi-layer structure. In some embodiments, the gate conductive layer includes a polysilicon layer. In some embodiments, the gate conductive layer includes combinations of a metal layer with a selected work function to enhance the device performance (work function metal layer), liner layer, wetting layer, adhesion layer, metal alloy, or metal silicide.

For example, the gate conductive layer includes one or more work function tuning layers conformally formed over the gate dielectric layer, and a metal-containing layer formed on the working function tuning layers and filling the openings through the BILD layer 64 and defined by the pairs of the gate spacers 52. The work function tuning layer(s) may include TiAl, TiN, TiAlN, HfAlC, TaN, HfN, AlN, $TiC_xN_y$, TiC—TiN, TaC, TiSiN, TaSiN, TaTiN, TiAlN, TaAlN, or the like. The work function tuning layers may be formed using ALD, CVD, or the like. The metal-containing layer is tungsten (W), aluminum (Al), cobalt (Co), ruthenium (Ru), a combination thereof, or the like, deposited using CVD, PVD, the like, or a combination thereof.

The work function tuning layer(s) provides an N-type or P-type work function for an N-type FinFET or a P-type FinFET, respectively. For example, a first work function tuning layer (e.g., for N-type devices) includes metals having a work function substantially aligned with a work function of the substrate conduction band, or at least substantially aligned with a work function of the conduction band of the channel region of the fin. Similarly, for example, a second work function tuning layer (e.g., for P-type devices) includes metals having a work function substantially aligned with a work function of the substrate valence band, or at least substantially aligned with a work function of the valence band of the channel region of the fin.

Additionally, in an embodiment, the replacement gates 70 each includes a dielectric helmet that protects the gate structure below the dielectric helmet during a later self-aligned contact (SAC) etch. For example, each gate structure between the pairs of the spacers 52 as mentioned above is partially recessed by performing an etch-back process. The etching process is selective to the gate dielectric layer and the work function tuning layer. The etching process includes a dry etch and/or a wet etch, and may be isotropic or anisotropic. The recess formed above the gate structure is filled with a dielectric material to form the dielectric helmet, for example, by a deposition process. For example, the dielectric helmet includes dielectric materials, such as silicon carbide, silicon nitride, silicon oxynitride, or the like. A planarization process, such as a CMP, is performed to remove the excess portions of the dielectric material to expose a top surface of each gate structure between the pairs of the spacers 52.

Figure 11A:
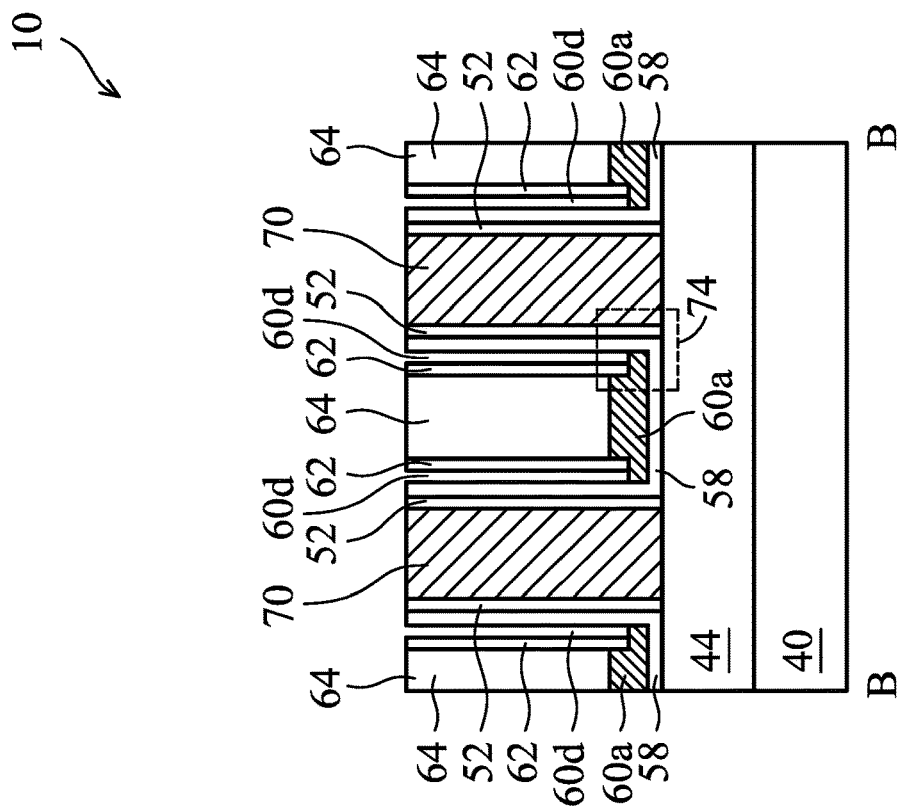
Figure 11B:
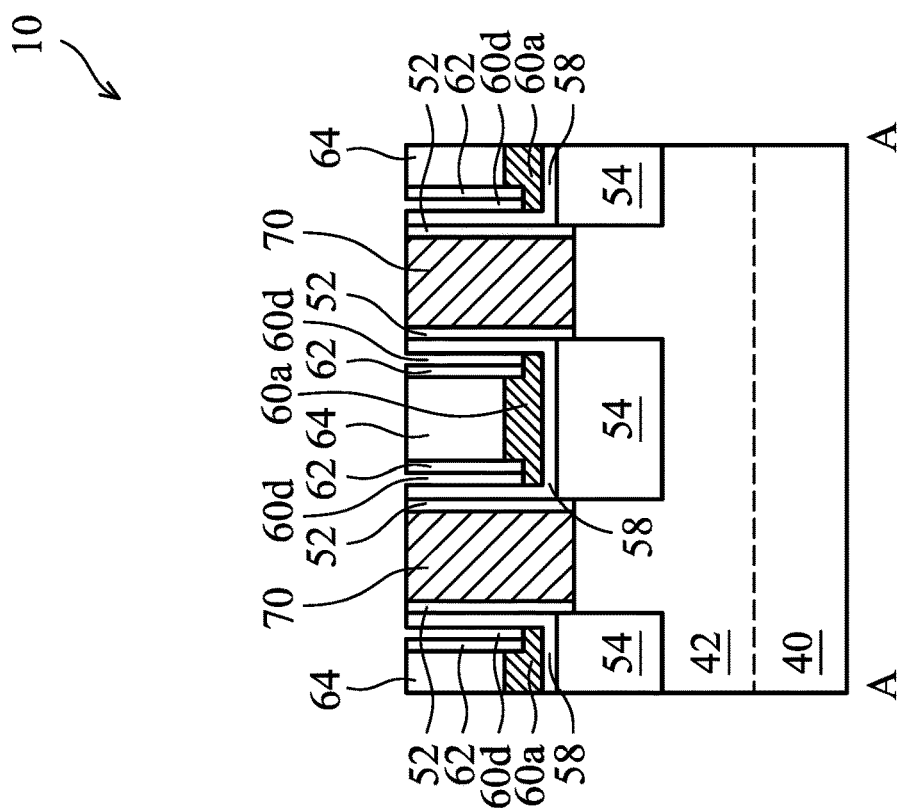

FIG. 11A shows a cross-sectional view of the FinFET device 10 along the A-A line shown in FIG. 2 and FIG. 11B shows a cross-sectional view of the FinFET device 10 along the B-B in the FIG. 2 after a dummy spacer removal. In FIGS. 11A-11B, air gaps 60d are formed by removing the dummy spacers 60b. For example, a suitable etching process selective to the materials of the dummy spacers 60b is performed. The etching does not significantly etch the protection layers 62 and the BCESL 58 adjacent to the dummy spacers 60b. As a result, an entirety of each dummy spacer 60b as shown in FIG. 10A or 10B is removed, and openings between the protection layers 62 and the BCESL 58 form the air gaps 60d. The air gaps 60d function as an air spacer and reduce parasitic capacitance between replacement gates and later-formed source/drain contacts, hence improving performance of resulting FinFET devices.

In some other examples, instead of removing the entirety of the dummy spacers 60b, upper portions of the dummy spacers 60b are removed. As a result, an air gap exists at an upper portion of a space between the respective protection layer 62 and the BCESL 58 (or the spacer 52). For example, portions of the dummy spacers 60b above a height higher or lower than the top of the fin 42 are removed. As a result, lower portions of the dummy spacers 60b below the height remain, and air gaps between the later-formed source/drain contacts and the replacement gates are obtained.

FIGS. 11C-11E are enlarged views of a region 72 indicated in FIG. 11A in accordance with some embodiments. The region 72 is near a top of the fin 42 (e.g., the source/drain region 54) and a bottom of the spacer 52. The enlarged views show different scenarios of how a portion of the stress liners 60 is distributed at a bottom of the air gaps 60d. In FIG. 11C example, a portion of the stress liner 60a is formed at the bottom of the air gap 60d. A top surface 72a of the stress liner 60a at the bottom of the air gap 60d is about in a same level as the bottom of the protection layer 62. In FIG. 11D example, the stress liner 60a extends to a bottom portion of the space between the BCESL 58 and protection layer 62. A top surface 72b of the stress liner 60a at the bottom of the air spacer 60d is above the bottom of the protection layer 62, at a position higher than the top surface 72a. Moreover, in FIG. 11E example, the stress liner 60a does not extend over an inner sidewall of the protection layer 62. A side surface 72c of the stress liner 60A does not protrude over the inner sidewall of the protection layer 62. Of course, FIGS. 11C-11E are used to show three non-limiting examples, other examples include different amounts of oxide of the stress liner 60a residing at the bottom of the air gaps 60d.

Moreover, in some embodiments at another region 74 indicated in FIG. 11B that is near the surface of the isolation region 44, distributions of oxide of the stress liner 60a at the bottom of the air gap 60d are similar to those in the region 72 illustrated above.

In addition, as shown in FIGS. 11C-11E, bottoms of the protection layers 62 are separated from various structures (e.g., the BCESL 58, and the source/drain regions 54, or tops of the fin 42) below the protection layers 62 by the stress liner 60a. This is a result of the fabrication process described herein in which the pre-stress liner 60 is first formed followed by forming the protection layers 62 over the pre-stress liner 60 extending along the sidewalls of the respective gate structures. The separation between the protection layers 62 and the structures below by the stress liners 60a similarly takes place at bottom portions of the protection layers 62 along a profile of the source/drain regions 54, and the surfaces of the isolation regions 44.

Further, as shown in FIG. 11C or 11D, the stress liner 60a extends to the bottom of a space between the protection layer 62 and the BCESL 58. In FIG. 11D example, the stress liner 60a encloses a bottom portion of the protection layer 62. Thus enclosure takes place at the bottom portion of the protection layer 62 that extends along a profile of the respective source/drain region 54 as well as the respective isolation region 44.

FIG. 12A shows a cross-sectional view of the FinFET device 10 along the A-A line shown in FIG. 2 and FIG. 12B shows a cross-sectional view of the FinFET device 10 along the B-B in the FIG. 2 after a formation of an upper inter-layer dielectric layer and contact plugs. In FIGS. 12A-12B, an upper inter-layer dielectric (UILD) layer 76 and contact plugs 78 are formed. For example, the UILD layer 76 is deposited over top surfaces of the replacement gates 70, the spacers 52, the BCESL 58, the protection layers 62, and the IDL layer 64. As a result, the top of the air gaps 60d are sealed by the UILD layer 76. After forming the UILD layer 76, first contact plug openings through the UILD layer 76 and the BILD layer 64 are formed to expose the source/drain regions 54. The first contact plug openings are filled with a conductive material to form contact plugs 78. The BCESL 58 is also removed, so that the contact plugs 78 extend to the source/drain regions 54. Also, second contact plug openings (not shown) in the UILD layer 76, and the dielectric helmets at the tops of the replacement gates 70 if exists, are formed to expose the replacement gates 70. The second contact plug openings are filled with a conductive material to form the contact plugs (not shown) in contact with the replacement gate 70.

As shown in FIG. 12A, the resulting FinFET device includes a pair of multi-layer gate spacers disposed along the sidewalls of each replacement gate 70. Each multi-layer gate spacer includes a first spacer layer (e.g., the spacer 52) adjacent to the replacement gate 70, a second spacer layer (e.g., the protection layer 62) that is at a side of the first spacer layer opposite to the replacement gate 70, and an air gap 60d between the first and second spacer layers. The respective stress liner 60a separates a bottom portion of the second spacer layer from the source/drain region 54 below the second spacer layer. Additionally, at one side of each replacement gate 70, the BCESL 58 extends along the sidewall of the first spacer layer, below the stress liner 60a, and along the profile of the source/drain region 54. Further, at each replacement gate 70, an oxygen-containing layer (e.g., the BILD layer 64) extends along and covers the pair of gate spacers, and a portion of the stress liner 60a not covered by the bottom portion of the respective second spacer layer.

It should be noted that additional steps can be provided before, during, and after the fabrication processes described with reference to FIGS. 3-12B, and some of the steps described can be replaced, eliminated, or performed in a different order. The resulting FinFET devices may include additional features, which may be formed by subsequent processing. For example, various conductive plugs/lines and multilayers interconnect features (e.g., metal layers and interlayer dielectrics) are formed over the substrate 40. For example, a multilayer interconnection includes vertical interconnects, such as conventional plugs or contacts, and horizontal interconnects, such as metal lines. The various interconnection features may implement various conductive materials including copper, tungsten, and/or silicide. In some examples, a damascene and/or dual damascene process is used to form a copper related multilayer interconnection structure.

Figure 13:
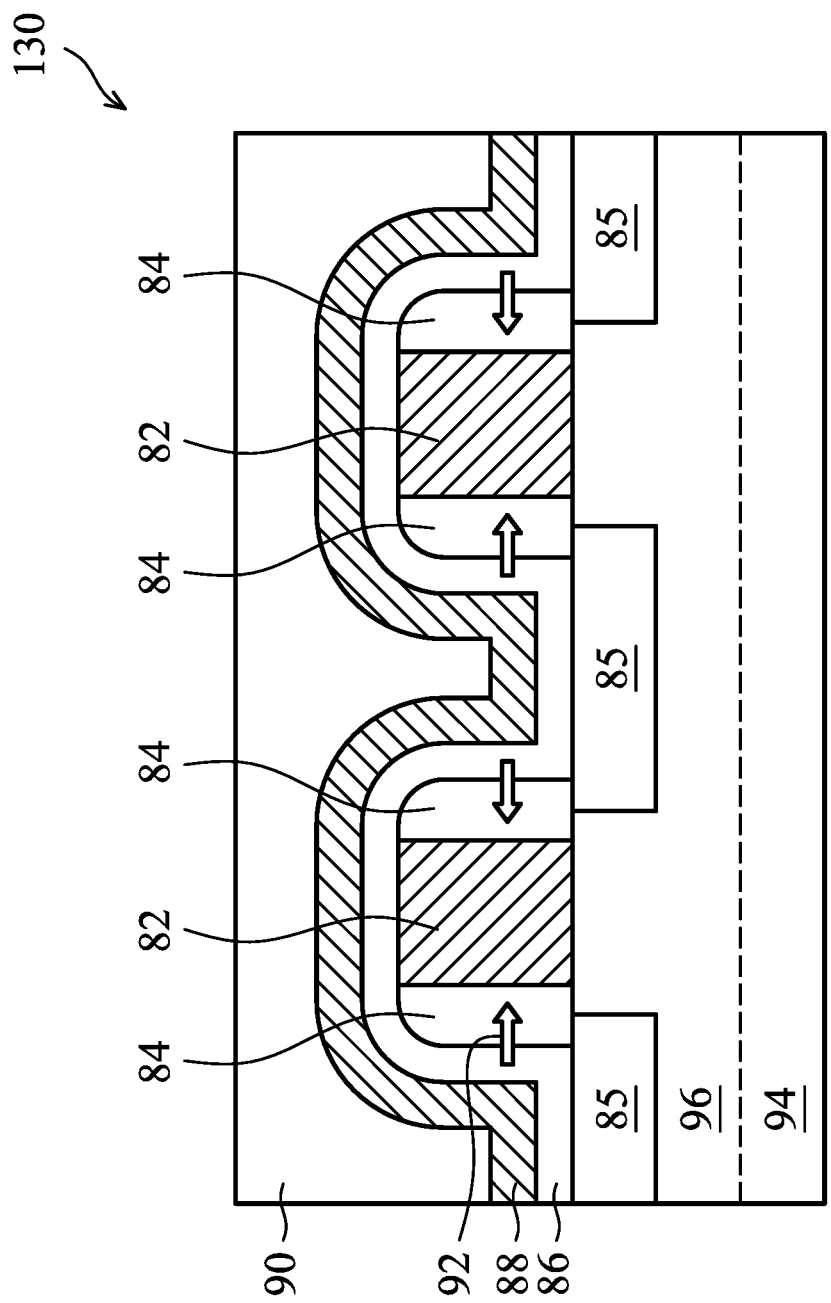
FIG. 13 is a cross-sectional view of another FinFET device.

FIG. 13 illustrates a cross-sectional view of a related FinFET device 130 that suffers from gate structure deformation at an intermediate stage according to a related fabrication process. The cross-section view is taken from a vertical plane across a fin 96 formed on a substrate 94. In FIG. 13, after dummy gates 82, gate spacers 84, and source/drain regions 85 are formed, a BCESL 86 is conformally formed over the substrate 94 covering the gate structures 82 and 84, and source/drain regions 85. A pre-stress liner is subsequently conformally formed over the BCESL 86. An oxygen-containing ILD layer 90 is formed over the substrate 94. An annealing process is then performed to oxidize the pre-stress liner to form a stress liner 88.

As shown, the stress liner 88 induces compressive stresses to the gate structures (each including the dummy gate 82 and a pair of spacers 84) as represented by arrows 92. The compressive stresses may deform the gate structure. For example, in later stages of the fabrication process, the dummy gates 82 are removed resulting in trenches between pairs of gate spacers 84. Due to the compressive stresses induced by the stress liners 88, a width between two spacers 84 at a top portion of the trenches may be decreased, which causes difficulties for filling the trench to form a replacement gate structure.

In contrast, in the fabrication process disclosed with reference to FIGS. 3-12B, a protection layer is used to protect a portion of a pre-stress liner on sidewalls of a gate structure from being oxidized. The protected portion is later converted into an air gap. Accordingly, the fabrication process disclosed with reference to FIGS. 3-12B avoids or minimizes the adverse effect of converting the entirety of the pre-stress liner to a stress liner. In addition, compared with forming a stress liner and an air gap independently, using a single film (the pre-stress liner) to serve two purposes (used as a basis for forming the stress liner and a dummy spacer for forming the air gaps) reduces complexity of the respective fabrication process and improves the efficiency.

While FinFET devices are used as examples for illustration of the fabrication processes of forming air gaps and stress liners based on a pre-stress liner, the methods or technologies disclosed herein are not limited to FinFET devices. Generally, the concepts described herein can be applied to any suitable semiconductor devices where a gate structure controls a current channel, air gaps are implemented for reducing parasitic capacitance between contacts and the gate structure, and stress liners are implemented for enhancing carrier mobility in the channel. For example, those semiconductor devices includes planar devices (e.g., planar MOSFET), non-planar devices (e.g., FinFET, and nanowire FET), and the like.

Aspects of the disclosure provide a method for fabricating a semiconductor device. A pre-stress liner is formed over an intermediate structure. The intermediate structure includes a gate structure having sidewalls. A protection layer is formed. The protection layer covers a first portion of the pre-stress liner that extends along the sidewalls of the gate structure, but exposes a second portion of the pre-stress liner that is away from the sidewalls of the gate structure. An oxygen-containing layer is formed. The oxygen-containing layer covers the pre-stress liner and the protection layer. The oxygen-containing layer is separated from the first portion of the pre-stress liner by the protection layer. The intermediate structure is annealed such that the second portion of the pre-stress liner oxidizes by receiving oxygen from the oxygen-containing layer, while the first portion of the pre-stress liner remains unoxidized due to the protection layer.

Aspects of the disclosure provide a first semiconductor device. The first semiconductor device includes a gate structure having a source region and a drain region located on opposite sides of the gate structure. The semiconductor device further includes a gate spacer extending along a sidewall of the gate structure. The gate spacer includes a first spacer layer adjacent to the sidewall of the gate structure and a second spacer layer that is arranged generally parallel to the first spacer layer so that an air gap is formed between the first and second spacer layers. The semiconductor device further includes a stress liner that separates the second spacer layer from contacting the source or drain regions.

Aspects of the disclosure further provide a second semiconductor device. The second semiconductor device includes a substrate, a fin protruding from the substrate, and a gate structure straddling the fin and having sidewalls. The second semiconductor device further includes a source region and a drain region located on opposite sides of the gate structure, and a gate spacer extending along a sidewall of the gate structure. The gate spacer includes a first spacer layer adjacent to the sidewall of the gate structure, a second spacer layer arranged parallel to the first spacer layer so that an air gap is formed between the first and second spacer layers. The second semiconductor device further includes a layer of oxidized material enclosing a bottom portion of the second spacer layer. The layer of oxidized material extends along a surface of the source region or the drain regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a semiconductor device, comprising:
   forming a pre-stress liner over a structure that includes a gate structure having sidewalls;
   forming a protection layer that selectively covers a first portion of the pre-stress liner that extends along the sidewalls of the gate structure, and exposes a second portion of the pre-stress liner that is away from the sidewalls;
   forming an oxygen-containing layer that covers the pre-stress liner and the protection layer, the oxygen-containing layer being separated from the first portion of the pre-stress liner by the protection layer;
   annealing the structure such that the second portion of the pre-stress liner oxidizes by receiving oxygen from the oxygen-containing layer while the first portion of the pre-stress liner remains unoxidized due to the protection layer; and
   forming an air gap between the protection layer and the sidewalls of the gate structure by removing the first portion of the pre-stress liner on the sidewalls of the gate structure.

2. The method of claim 1, wherein the air gap separates the protection layer from contacting the structure.

3. The method of claim 1, wherein the oxygen-containing layer is in contact with the second portion of the pre-stress liner.

4. The method of claim 1, wherein the structure includes a source/drain region, and the second portion of the pre-stress liner is arranged over a surface of the source/drain region.

5. The method of claim 1, further comprising:
   forming a fin of a fin field effect transistor (FinFET) protruding upwardly from a substrate;
   forming a dummy gate straddling the fin and perpendicular to the fin;
   forming a pair of spacers extending along opposite sidewalls of the dummy gate;
   forming a pair of source/drain regions at opposite sides of the dummy gate;
   forming a bottom contact etch stop layer conformally over the structure including the substrate, the fin, the dummy gate, the pair of spacers, and the pair of source/drain regions; and
   forming the pre-stress liner conformally extending along and covering the bottom contact etch stop layer.

6. The method of claim 1, wherein the pre-stress liner includes silicon, germanium, silicon germanium, or aluminum.

7. A method for fabricating a semiconductor device, comprising:
   providing a substrate, a gate, a first source/drain region, and a second source/drain region, wherein the gate is over the substrate, and the first source/drain region and the second source/drain region are in the substrate and over opposite sides of the gate;
   forming a pre-stress liner over a first sidewall of the gate and a first top surface of the first source/drain region;
   forming a protection layer over the pre-stress liner over the first sidewall of the gate, wherein the protection layer exposes an upper surface of a first portion of the pre-stress liner over the first source/drain region, the upper surface faces away from the first source/drain region, and the upper surface is higher than the first top surface of the first source/drain region and lower than a second top surface of the gate; and
   oxidizing the first portion of the pre-stress liner over the first top surface of the first source/drain region.

8. The method of claim 7, further comprising:
   removing a second portion of the pre-stress liner between the protection layer and the gate after oxidizing the first portion of the pre-stress liner over the first top surface of the first source/drain region.

9. The method of claim 7, wherein the first portion of the pre-stress liner over the first top surface of the first source/drain region is thicker than a second portion of the pre-stress liner over the first sidewall of the gate after oxidizing the first portion of the pre-stress liner over the first top surface of the first source/drain region.

10. The method of claim 7, further comprising:
    forming a dielectric layer over the gate, the protection layer, and the pre-stress liner before oxidizing the first portion of the pre-stress liner over the first top surface of the first source/drain region.

11. The method of claim 10, wherein the dielectric layer is in direct contact with both of the protection layer and the pre-stress liner.

12. The method of claim 7, wherein the first portion of the pre-stress liner over the first top surface of the first source/drain region is oxidized and forms a stress liner, the stress liner covers a first lower portion of a second sidewall of the protection layer, and the second sidewall faces away from the gate.

13. The method of claim 12, wherein the protection layer is partially embedded in the stress liner.

14. The method of claim 12, wherein a second lower portion of the protection layer is between the stress liner and the gate.

15. A method for fabricating a semiconductor device, comprising:
    providing a substrate, a gate, a first source/drain region, and a second source/drain region, wherein the gate is over the substrate, and the first source/drain region and the second source/drain region are in the substrate and over opposite sides of the gate;

forming a pre-stress liner over a sidewall of the gate and a top surface of the first source/drain region;

forming an oxygen-containing layer over the pre-stress liner, wherein the oxygen-containing layer is in direct contact with the pre-stress liner covering the top surface of the first source/drain region, and the oxygen-containing layer is spaced apart from the pre-stress liner covering the sidewall of the gate; and annealing the oxygen-containing layer and the pre-stress liner to oxidize the pre-stress liner covering the top surface of the first source/drain region, wherein the pre-stress liner covering the top surface is oxidized and forms a stress liner.

16. The method of claim 15, further comprising:

forming a protection layer over the pre-stress liner over the sidewall of the gate before forming the oxygen-containing layer over the pre-stress liner.

17. The method of claim 16, wherein the stress liner under the oxygen-containing layer is thicker than the stress liner under the protection layer.

18. The method of claim 15, further comprising:

after annealing the oxygen-containing layer and the pre-stress liner, removing the pre-stress liner covering the sidewall of the gate to form an air gap between the gate and the oxygen-containing layer.

19. The method of claim 18, further comprising:

forming a dielectric layer over the gate, the air gap, and the oxygen-containing layer after removing the pre-stress liner covering the sidewall of the gate.

20. The method of claim 19, further comprising:

forming a contact structure passing through the dielectric layer, the oxygen-containing layer, and the stress liner after forming the dielectric layer over the gate, the air gap, and the oxygen-containing layer.

* * * * *